United States Patent
Lim et al.

(10) Patent No.: US 9,711,511 B1
(45) Date of Patent: Jul. 18, 2017

(54) VERTICAL CHANNEL TRANSISTOR-BASED SEMICONDUCTOR MEMORY STRUCTURE

(71) Applicant: GLOBALFOUNDRIES Inc., Grand Cayman (KY)

(72) Inventors: Kwan-Yong Lim, Niskayuna, NY (US); Ryan Ryoung-Han Kim, Albany, NY (US); Motoi Ichihashi, Sunnyvale, CA (US); Youngtag Woo, San Ramon, CA (US); Deepak Nayak, Fremont, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/193,867

(22) Filed: Jun. 27, 2016

(51) Int. Cl.
| H01L 29/66 | (2006.01) |
| H01L 27/11 | (2006.01) |
| H01L 29/78 | (2006.01) |
| H01L 29/423 | (2006.01) |
| H01L 29/10 | (2006.01) |
| H01L 29/417 | (2006.01) |

(52) U.S. Cl.
CPC ...... *H01L 27/1104* (2013.01); *H01L 29/1037* (2013.01); *H01L 29/41741* (2013.01); *H01L 29/4238* (2013.01); *H01L 29/7827* (2013.01)

(58) Field of Classification Search
CPC .............. H01L 27/11; H01L 29/78642; H01L 29/42392; H01L 27/1104
See application file for complete search history.

(56) References Cited

U.S. PATENT DOCUMENTS

| 7,407,847 B2 | 8/2008 | Doyle et al. |
| 8,154,086 B2 | 4/2012 | Masuoka et al. |
| 8,426,236 B2 * | 4/2013 | Cabral, Jr. ........ H01L 31/02242 136/244 |
| 8,754,481 B2 | 6/2014 | Masuoka et al. |
| 8,901,607 B2 | 12/2014 | Wang et al. |
| 9,385,195 B1 * | 7/2016 | Zhang ................. H01L 29/1033 |

(Continued)

OTHER PUBLICATIONS

Thean, et al., "Vertical Device Architecture for 5nm and beyond: Device & Circuit Implications," 2015 Symposium on VLSI Technology Digest of Technical Papers, p. T26-T27.

(Continued)

*Primary Examiner* — John C Ingham
*Assistant Examiner* — Frederick B Hargrove
(74) *Attorney, Agent, or Firm* — Wayne F. Reinke, Esq.; Heslin Rothenberg Farley & Mesiti P.C.

(57) ABSTRACT

A semiconductor memory structure (e.g., SRAM) includes vertical channels with a circular, square or rectangular cross-sectional shape. Each unit cell can include a single pull-up vertical transistor and either: one pull-down vertical transistor and one pass-gate vertical transistor; or two or more of each of the pull-down and pass-gate vertical transistors. The structure may be realized by providing adjacent layers of undoped semiconductor material, forming vertical channels for vertical transistors, the vertical channels situated on each of the adjacent layers, doping a first half of each of the adjacent layers with a n-type or p-type dopant, doping a second half of each of the adjacent layers with an opposite type dopant to that of the first half, forming wrap-around gates surrounding the vertical channels, and forming top electrodes for the vertical transistors.

16 Claims, 18 Drawing Sheets

(56) References Cited

U.S. PATENT DOCUMENTS

| | | | |
|---|---|---|---|
| 9,472,446 B2 | 10/2016 | Xie et al. | |
| 2010/0219483 A1* | 9/2010 | Masuoka | H01L 21/845 |
| | | | 257/369 |
| 2011/0018056 A1* | 1/2011 | Takeuchi | H01L 21/76895 |
| | | | 257/329 |
| 2011/0303973 A1* | 12/2011 | Masuoka | H01L 21/26586 |
| | | | 257/329 |
| 2014/0197457 A1 | 7/2014 | Wang et al. | |
| 2015/0179655 A1 | 6/2015 | Nakanishi et al. | |
| 2015/0318288 A1 | 11/2015 | Lim et al. | |
| 2015/0371892 A1 | 12/2015 | Xie et al. | |
| 2016/0078922 A1* | 3/2016 | Liaw | H01L 29/66666 |
| | | | 365/51 |
| 2016/0197069 A1* | 7/2016 | Morrow | H01L 21/82343 |
| | | | 257/393 |

OTHER PUBLICATIONS

Non-Final Office Action for U.S. Appl. No. 14/307,902 Oct. 9, 2015.

Final Office Action for U.S. Appl. No. 14/307,902 (U.S. Publication No. 2015/0371892) May 20, 2016.

Lim et al., U.S. Appl. No. 15/193,902, entitled "Vertical Channel Transistor-Based Semiconductor Structure" Jun. 27, 2016.

* cited by examiner

VERTICAL CHANNEL TRANSISTOR-BASED SEMICONDUCTOR MEMORY STRUCTURE

BACKGROUND OF THE INVENTION

Technical Field

The present invention generally relates to transistor-based semiconductor devices. More particularly, the present invention relates to vertical channel transistor-based semiconductor memory structures.

Background Information

As semiconductor devices continue to scale down, the use of lithography has become untenable due to the limits of conventional lithographic equipment, while at the same time, companies want to continue to use the existing lithography equipment. In the past, the design of semiconductor structures went from planar to three-dimensional, which solved the issues of the time, but the time has come again for a new design.

Thus, a need exists for a way to continue to use lithography, while also having a design that can be downscaled.

SUMMARY OF THE INVENTION

The shortcomings of the prior art are overcome and additional advantages are provided through the provision, in one aspect, of a semiconductor structure. The semiconductor structure includes horizontally adjacent layers of conductive material, a plurality of transistors in process on the horizontally adjacent layers of conductive material, each transistor including a vertical channel and a gate electrode wrapped around the vertical channel, each of the adjacent layers of conductive material being a shared bottom source/drain electrode for some of the plurality of transistors. The semiconductor structure further includes a cross-coupled contact having at least two portions, each portion on the adjacent layers of conductive material, non-shared top source/drain electrodes on top of each vertical channel and associated gate electrode. The plurality of transistors includes at least two sets of transistors, each of the at least two sets of transistors including a pull-up transistor, at least two pull-down transistors and at least two pass gate transistors.

In accordance with another aspect, a semiconductor memory structure is provided. The semiconductor structure includes a plurality of vertical channel transistors that are horizontally adjacent, each vertical channel transistor including a shared bottom source/drain electrode, a vertical channel on the shared bottom source/drain electrode, a gate wrapped around the vertical channel, and a non-shared top source/drain electrode on the vertical channel and gate. The plurality of vertical channel transistors are grouped according to each non-shared top source/drain electrode into at least two sets, each of the at least two sets including a pull-up transistor, at least two pull-down transistors, and at least two pass-gate transistors.

In accordance with yet another aspect, a method of fabricating a semiconductor memory structure is provided. The method includes providing adjacent layers of undoped semiconductor material, and forming vertical channels for vertical transistors, the vertical channels situated on each of the adjacent layers. The method further includes doping a first half of each of the adjacent layers with a n-type or p-type dopant, doping a second half of each of the adjacent layers with an opposite type dopant to that of the first half, forming wrap-around gates surrounding the vertical channels, and forming top electrodes for the vertical transistors. The wrap-around gates are self-aligned, forming the vertical channels includes forming one of a vertical channel having a circular cross-section and a vertical channel having a rectangular cross-section, and the transistors are formed in groups, each group comprising a single pull-up transistor, at least two pull-down transistors and at least two pass gate transistors.

These, and other objects, features and advantages of this invention will become apparent from the following detailed description of the various aspects of the invention taken in conjunction with the accompanying drawings.

DETAILED DESCRIPTION OF THE INVENTION

Figure 1:
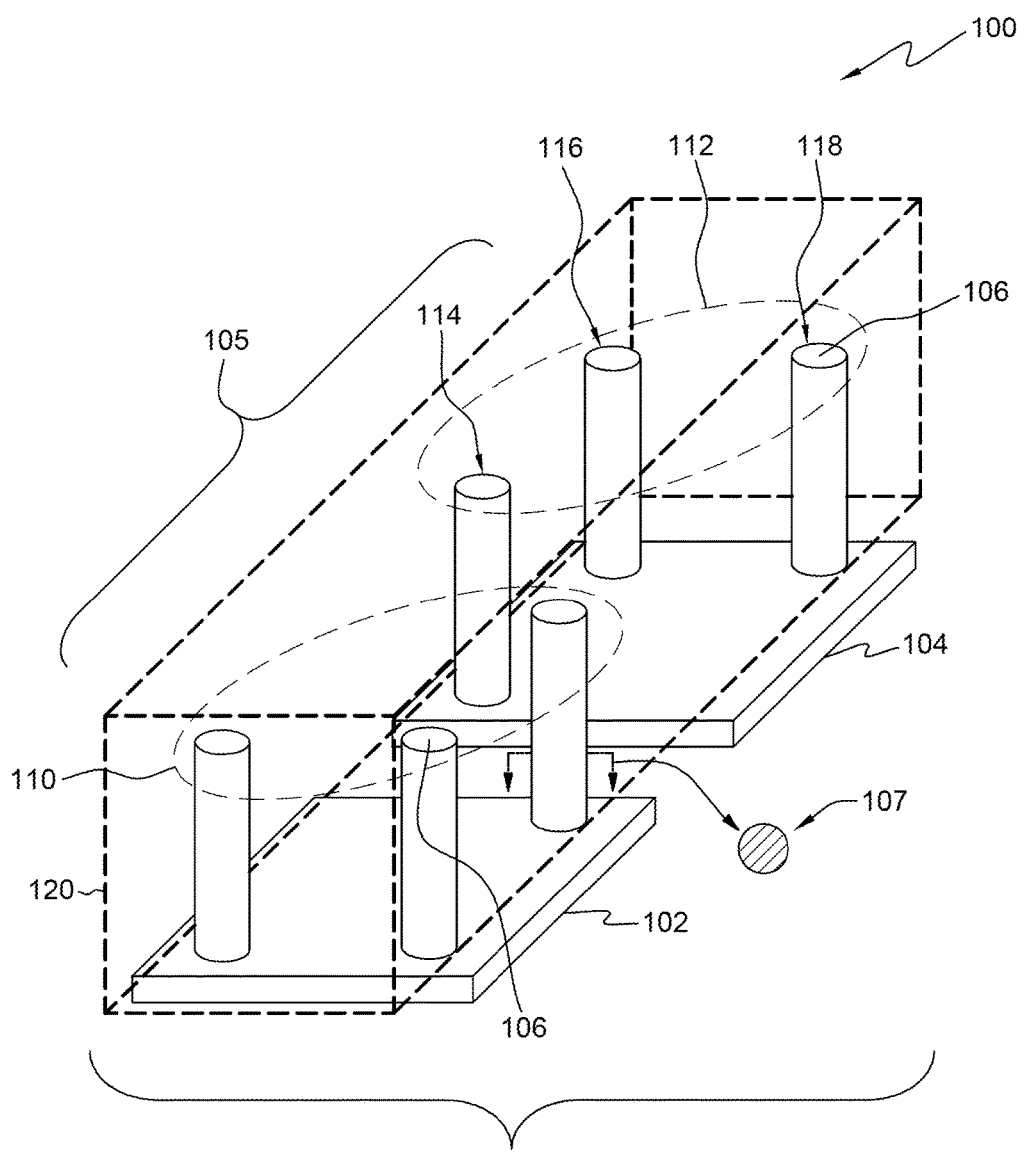
FIG. 1 is an elevational view of one example of a starting semiconductor memory structure at an intermediate stage of fabrication, the starting semiconductor memory structure including two adjacent square-shaped layers of undoped semiconductor material, transistors in process including vertical channels (also known as vertical fins) with a circular cross-sectional shape, and being situated on the two adjacent square-shaped layers, the transistors in process separated into two sets, each set including a pull-up transistor in process, a pull-down transistor in process and a pass gate transistor in process, the starting semiconductor memory structure when complete as described herein being a unit memory cell (e.g., a static random access memory cell), in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

Reference is made below to the drawings, which are not drawn to scale for ease of understanding, wherein the same reference numbers are used throughout different figures to designate the same or similar components.

FIG. 1 is an elevational view of one example of a starting semiconductor memory structure 100 at an intermediate stage of fabrication, the starting semiconductor memory structure including two adjacent square-shaped layers of undoped semiconductor material 102 and 104, transistors in process 105 including vertical channels 106 (also known as vertical fins) with a circular cross-sectional shape 107, and being situated on the two adjacent square-shaped layers, the transistors in process separated into two sets 110 and 112, each set including a pull-up transistor in process (e.g., pull-up transistor in process 114), a pull-down transistor in process (e.g., pull-down transistor in process 116) and a pass gate transistor in process (e.g., pass gate transistor in process 118), the starting semiconductor memory structure when complete as described herein being a unit memory cell 120 (e.g., a static random access memory cell), in accordance with one or more aspects of the present invention.

The starting structure may be conventionally fabricated, for example, using known processes and techniques. However, although only a portion is shown for simplicity, it will be understood that, in practice, many such structures are typically included on the same bulk substrate.

Figure 2:
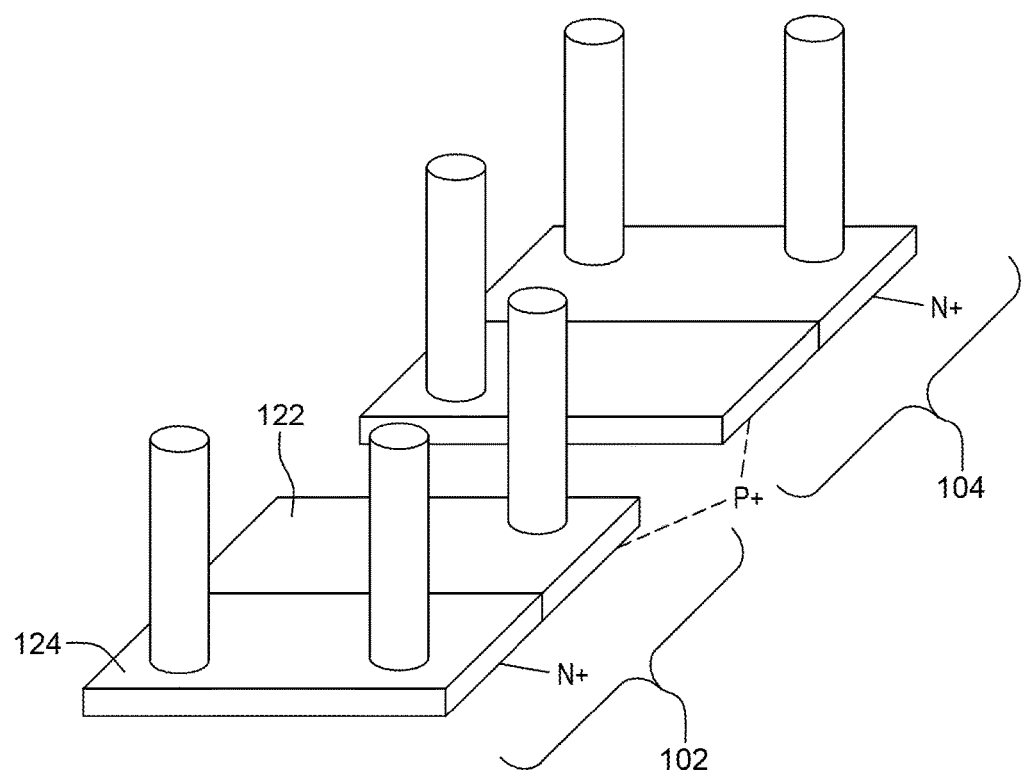
FIG. 2 is one example of the structure of FIG. 1 after doping the two adjacent square-shaped layers of undoped semiconductor material to be half p-type doped and half n-type doped, in accordance with one or more aspects of the present invention.

FIG. 2 is one example of the structure of FIG. 1 after doping the two adjacent square-shaped layers of undoped semiconductor material (FIGS. 1, 102 and 104) to be half p-type doped (e.g., p-type half 122) and half n-type doped (e.g., n-type half 124), in accordance with one or more aspects of the present invention.

Although not shown in the figures for simplicity, there may also be a lightly doped or undoped semiconductor layer between the corresponding n-type and p-type halves.

Figure 3:
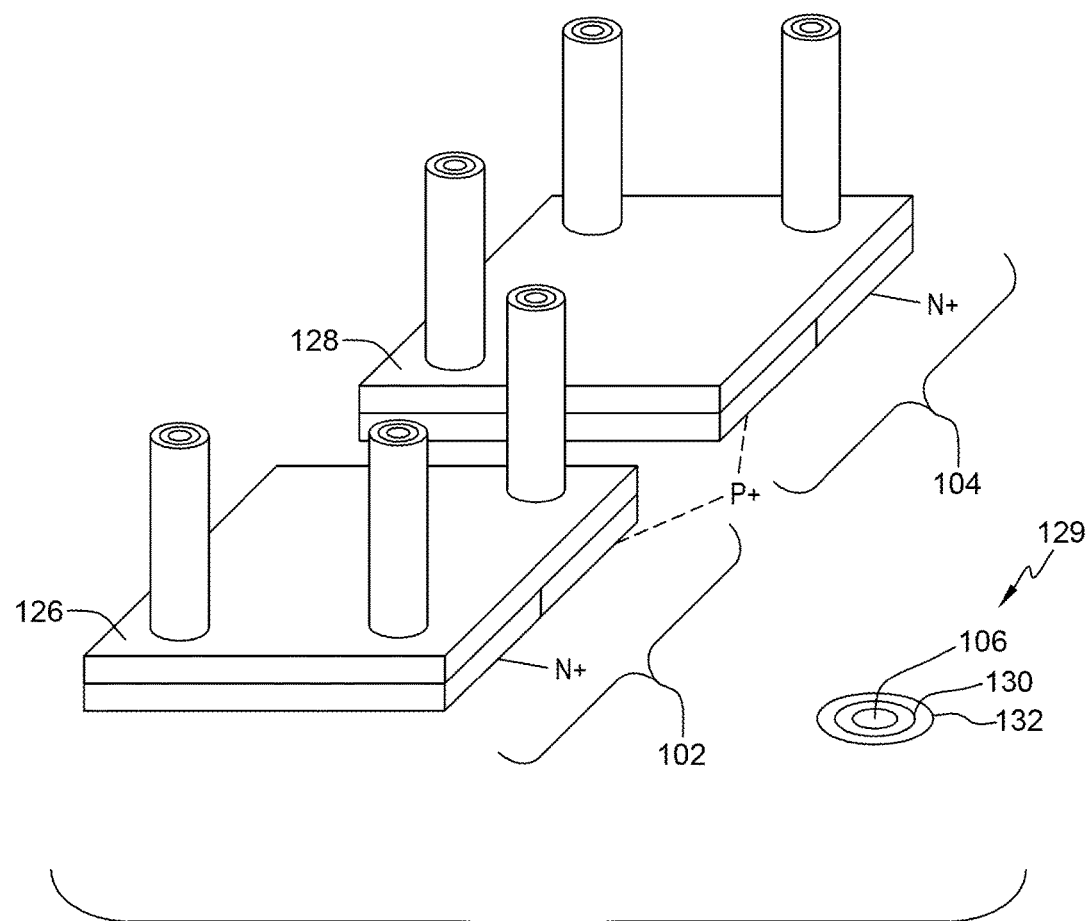
FIG. 3 depicts one example of the structure of FIG. 2 after forming conductive layers (e.g., metal or silicide) on the doped adjacent square-shaped layers, the conductive layers to act as bottom source/drain electrodes, and forming a dielectric layer (e.g., high-k dielectric; k>3.9) and a spacer layer (e.g., silicon nitride) around a vertical channel, in accordance with one or more aspects of the present invention.

FIG. 3 depicts one example of the structure of FIG. 2 after forming conductive layers 126, 128 (e.g., metal or silicide) on the doped adjacent square-shaped layers 102 and 104, the conductive layers to act as bottom source/drain electrodes, and forming dielectric layer 130 (e.g., high-k dielectric) and spacer layer 132 (e.g., silicon nitride) around vertical channel 106, in accordance with one or more aspects of the present invention.

As noted above, conductive layers 126 and 128 in FIG. 3 may include silicide. In one example, the silicide may be formed by, for example, salicidation after encapsulating each vertical channel with a spacer material (e.g., silicon nitride or silicon dioxide). As used herein, the term "high-k dielectric" refers to dielectric with a dielectric constant higher than 3.9 ($SiO_2$).

Figure 4:
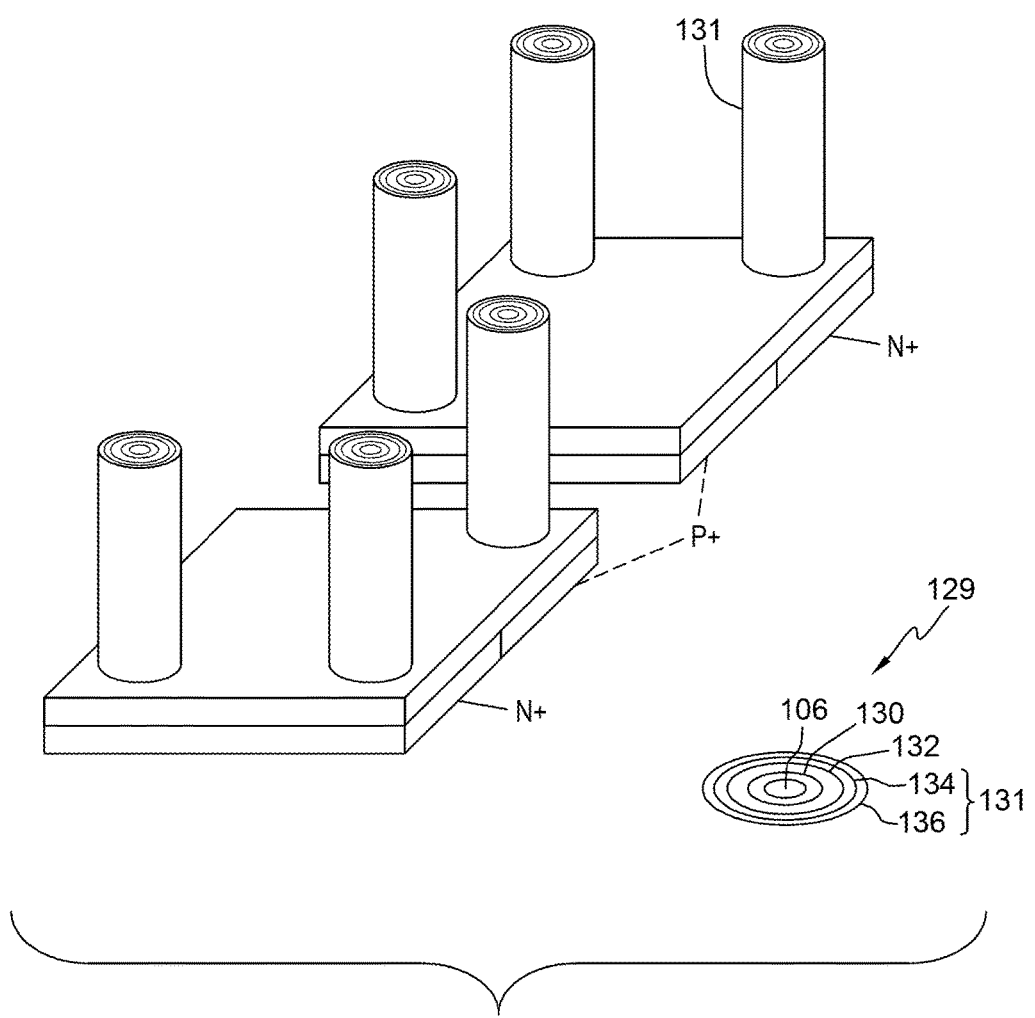
FIG. 4 depicts one example of the structure of FIG. 3 and an associated top-down view after formation of self-aligned metal gates therearound, the metal gates including one or more layers of work function material and an outer metal layer, in accordance with one or more aspects of the present invention.

FIG. 4 depicts one example of the structure of FIG. 3 and associated top-down view 129 after formation of self-aligned metal gates (e.g., metal gate 131) therearound, the metal gates including one or more layers of work function material 134 and an outer metal layer 136, in accordance with one or more aspects of the present invention.

Figure 5:
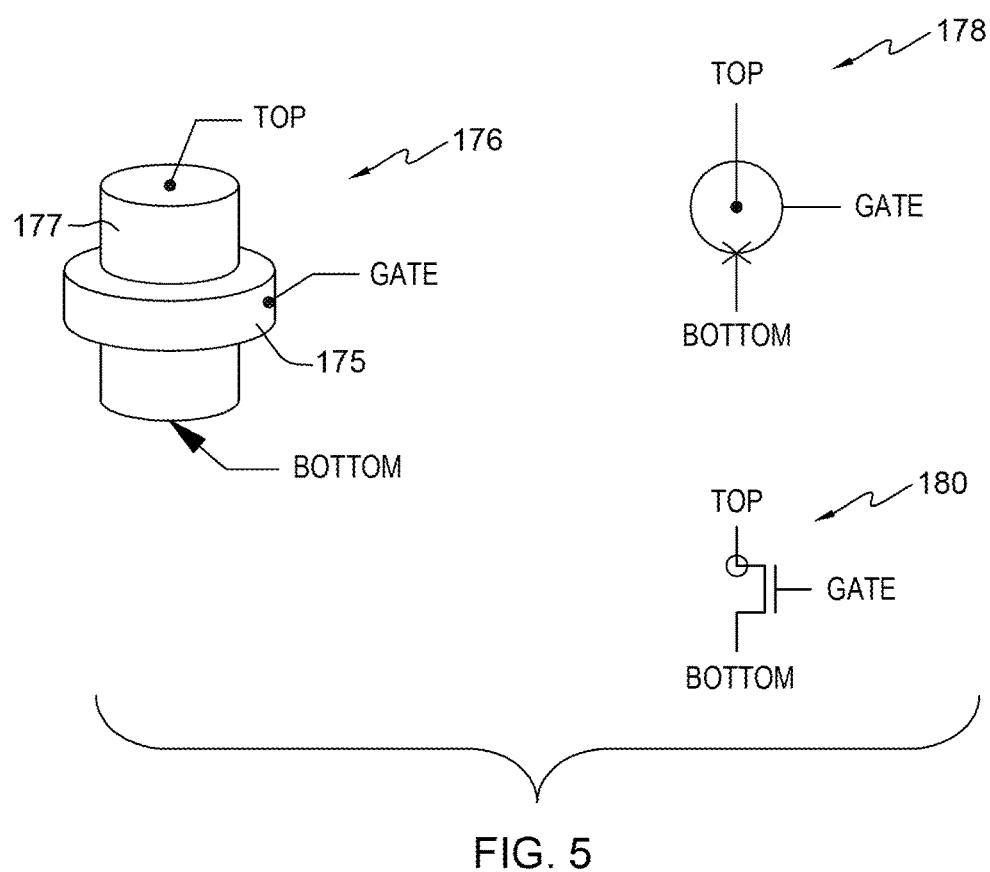
FIG. 5 is a perspective view of another example of a simplified vertical transistor, including a vertical channel with a cut-view of wrap-around gate, that can be used with the memory structure of FIG. 4, along with an accompanying top-down view and a corresponding schematic, in accordance with one or more aspects of the present invention.

FIG. 5 is a perspective view of another example of a simplified vertical transistor 176, including vertical channel 177 with cut-view of wrap-around gate 175, that can be used with the memory structure of FIG. 4, along with accompanying top-down view 178 and corresponding schematic 180, in accordance with one or more aspects of the present invention.

Figure 6:
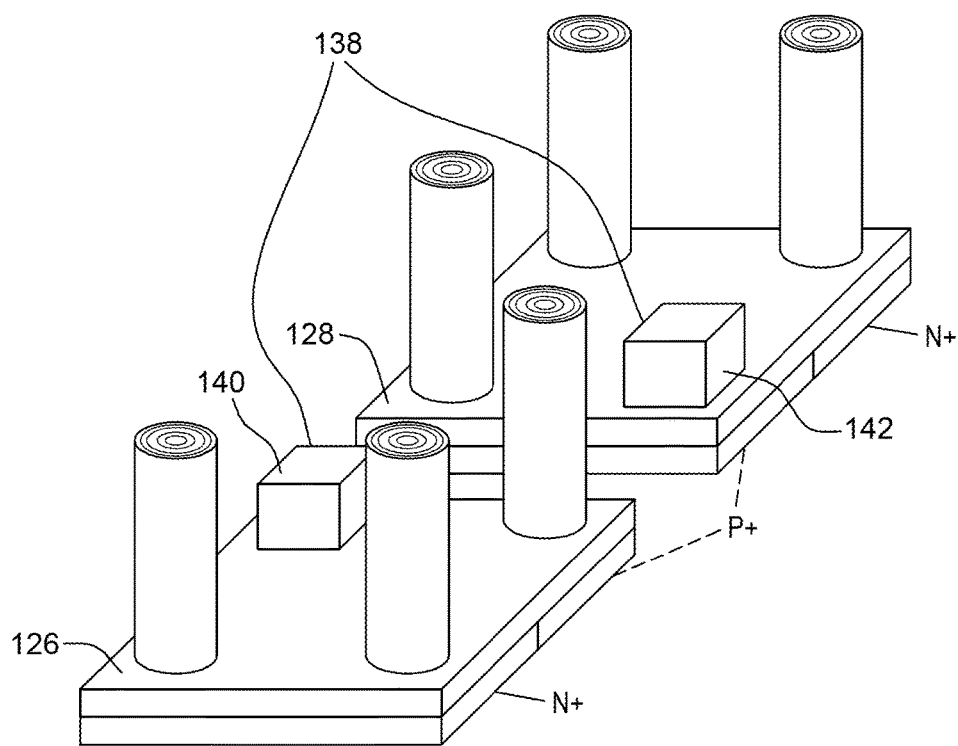
FIG. 6 depicts one example of the structure of FIG. 4 after formation of a cross-coupled (i.e., shared) contact having two parts on each of the layers of conductive material, in accordance with one or more aspects of the present invention.

FIG. 6 depicts one example of the structure of FIG. 4 after formation of a cross-coupled (i.e., shared) contact 138 having two parts 140 and 142 on each of the layers of conductive material 126 and 128, in accordance with one or more aspects of the present invention.

In one example, the cross-coupled contact of FIG. 6 may be formed using, for example, a SAV process with a routing gate pattern.

Figure 7:
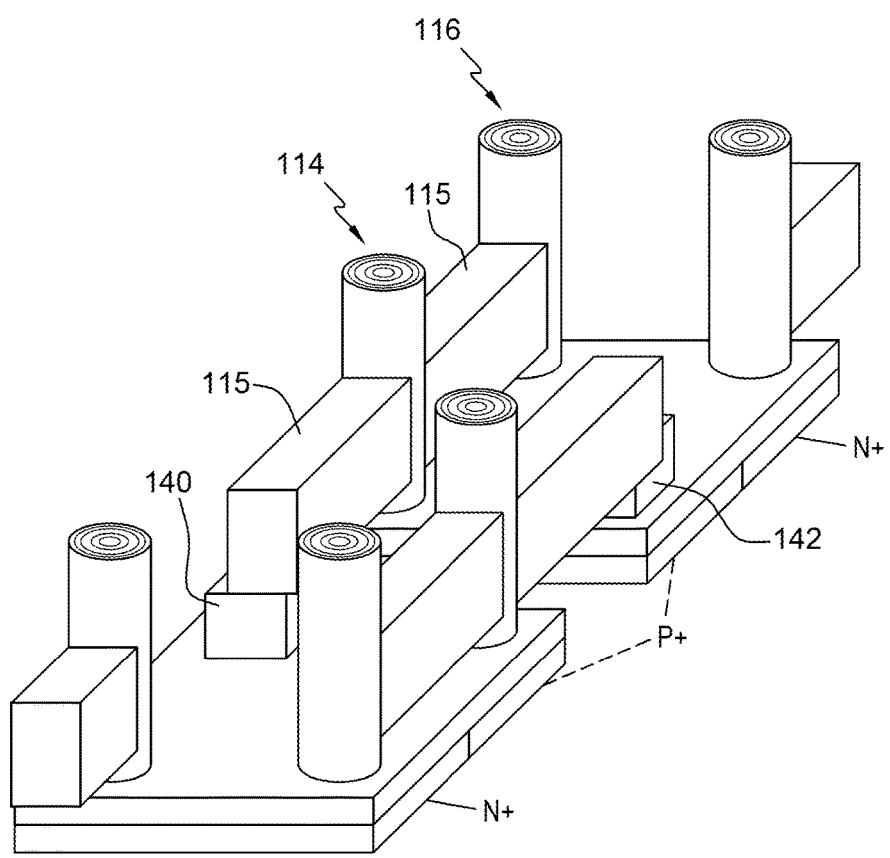
FIG. 7 depicts one example of the structure of FIG. 6 after electrically connecting, via routing gates, each pull-up transistor and its associated pull-down transistor to the shared contact parts, respectively, in accordance with one or more aspects of the present invention.

FIG. 7 depicts one example of the structure of FIG. 6 after electrically connecting, via routing gates (e.g., routing gates 115), each pull-up transistor (e.g., pull-up transistor 114) and its associated pull-down transistor (e.g., pull-down transistor 116) to the shared contact parts 140 and 142, respectively, in accordance with one or more aspects of the present invention.

Figure 8:
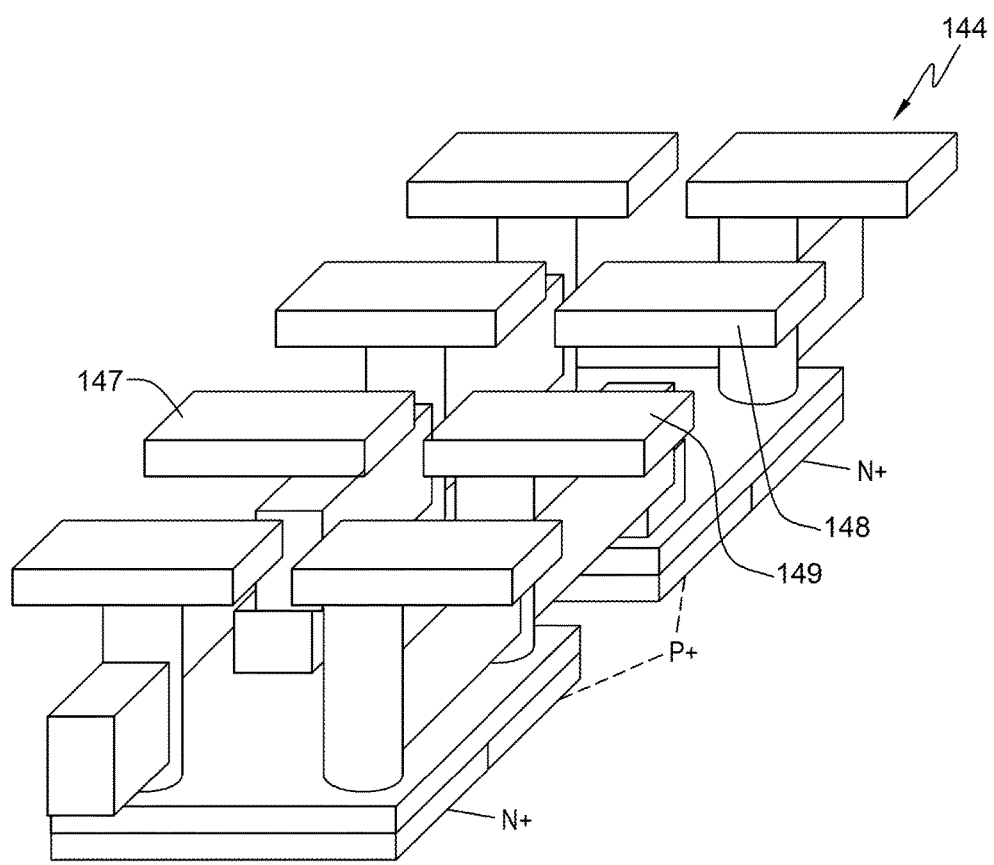
FIG. 8 depicts one example of the structure of FIG. 7 after formation of top source/drain electrodes, with optional floating electrodes, in accordance with one or more aspects of the present invention.

FIG. 8 depicts one example of the structure of FIG. 7 after formation of top source/drain electrodes 144, with optional floating electrode 148, in accordance with one or more aspects of the present invention.

As shown in FIG. 8, electrodes 147 and 149 are associated with the cross-coupled contact.

Figure 9:
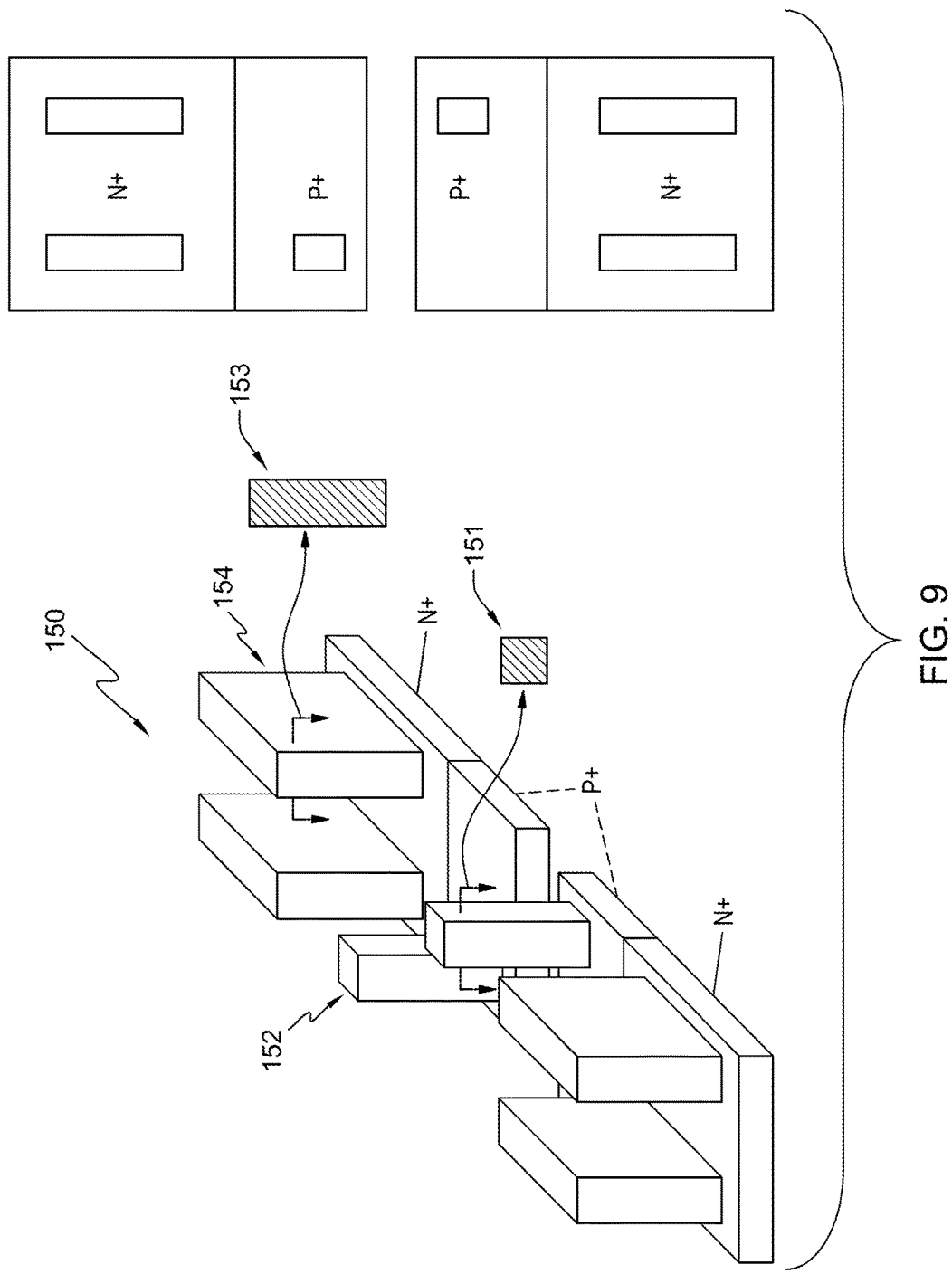
FIG. 9 is an elevational view of another example of a semiconductor memory structure in process, similar to that of FIG. 2, except replacing the circular cross-sectional shaped vertical channels with square cross-sectional shaped vertical channels and/or rectangular cross-sectional shaped ones, in accordance with one or more aspects of the present invention.

FIG. 9 is an elevational view of another example of a semiconductor memory structure in process 150, similar to that of FIG. 2, except replacing the circular cross-sectional shaped vertical channels with square cross-sectional shaped 151 vertical channels (e.g., vertical channel 152) and/or rectangular cross-sectional shaped 153 ones (e.g., vertical channel 154), in accordance with one or more aspects of the present invention.

Figure 10:
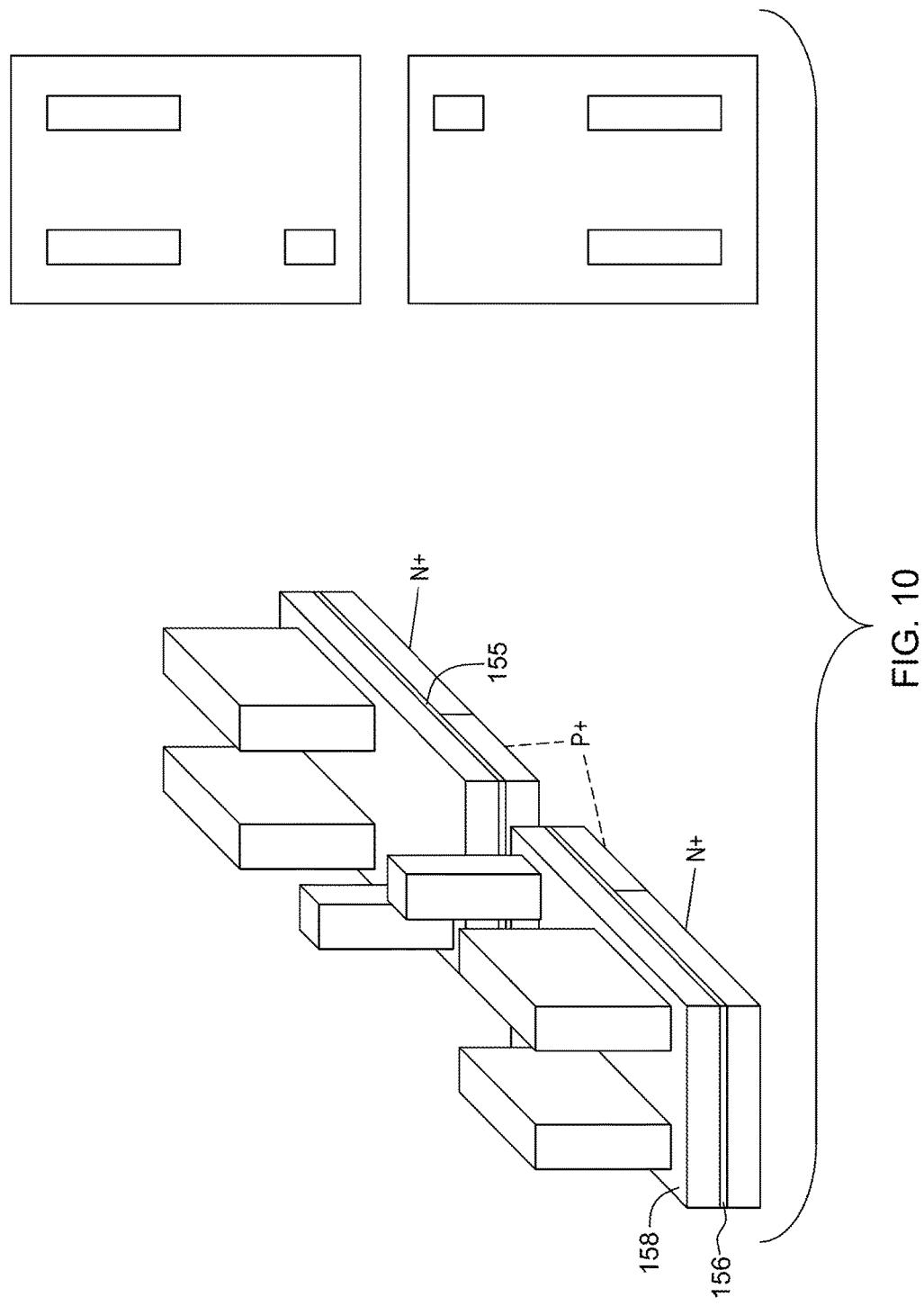
FIG. 10 depicts one example of the structure of FIG. 9 after formation of bottom source/drain electrodes with an optional bottom electrode hard mask, in accordance with one or more aspects of the present invention.

FIG. 10 depicts one example of the structure of FIG. 9 after formation of bottom source/drain electrodes (e.g., electrodes 155, 156) with an optional bottom electrode hard mask (e.g., electrode hard mask 158), in accordance with one or more aspects of the present invention.

Figure 11:
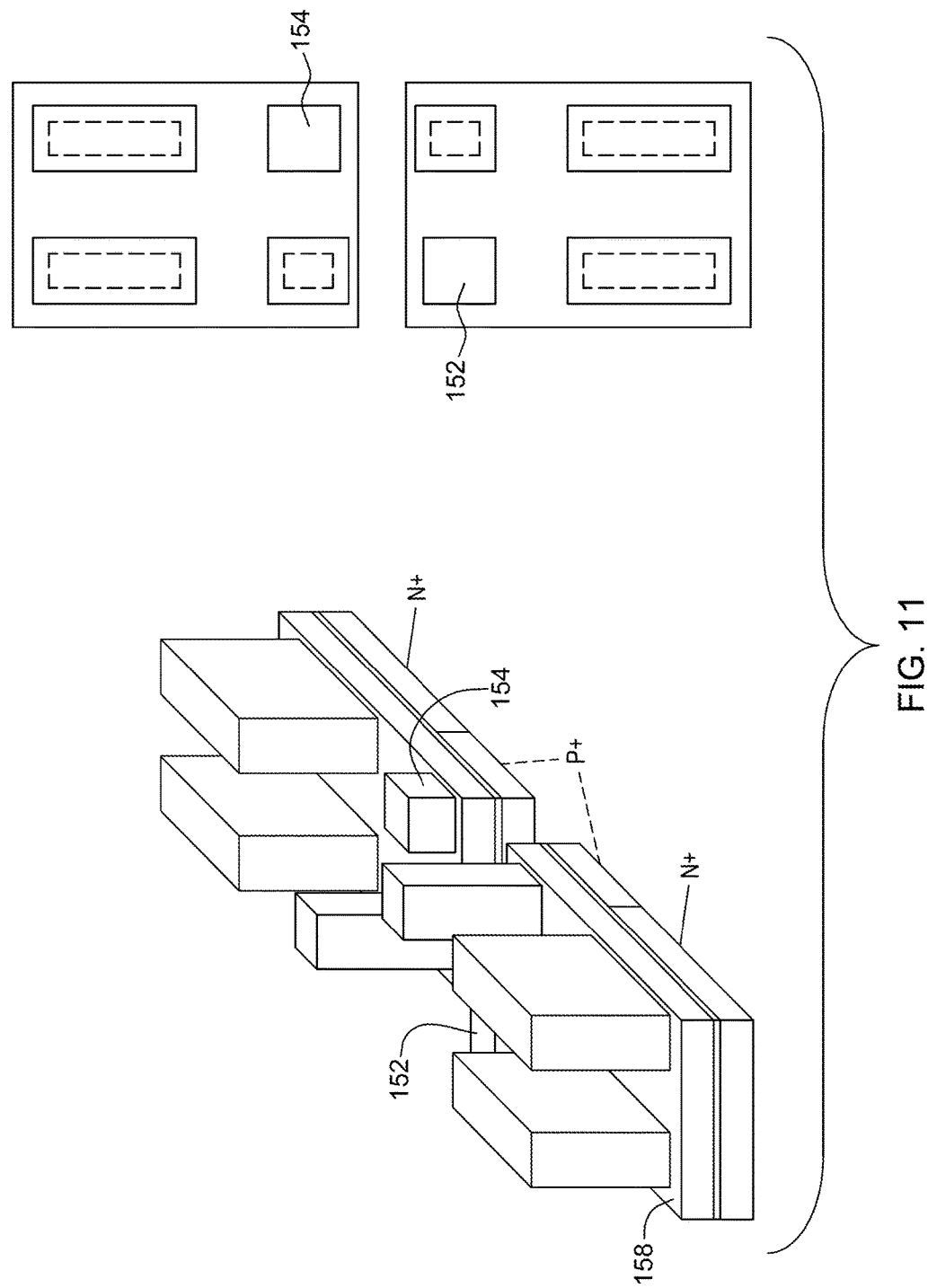
FIG. 11 depicts one example of the structure of FIG. 10 after the formation of cross-coupled contact portions, similar to that of FIG. 6, in accordance with one or more aspects of the present invention.

FIG. 11 depicts one example of the structure of FIG. 10 after the formation of cross-coupled contact portions 152 and 154, similar to that of FIG. 6, in accordance with one or more aspects of the present invention.

Figure 12:
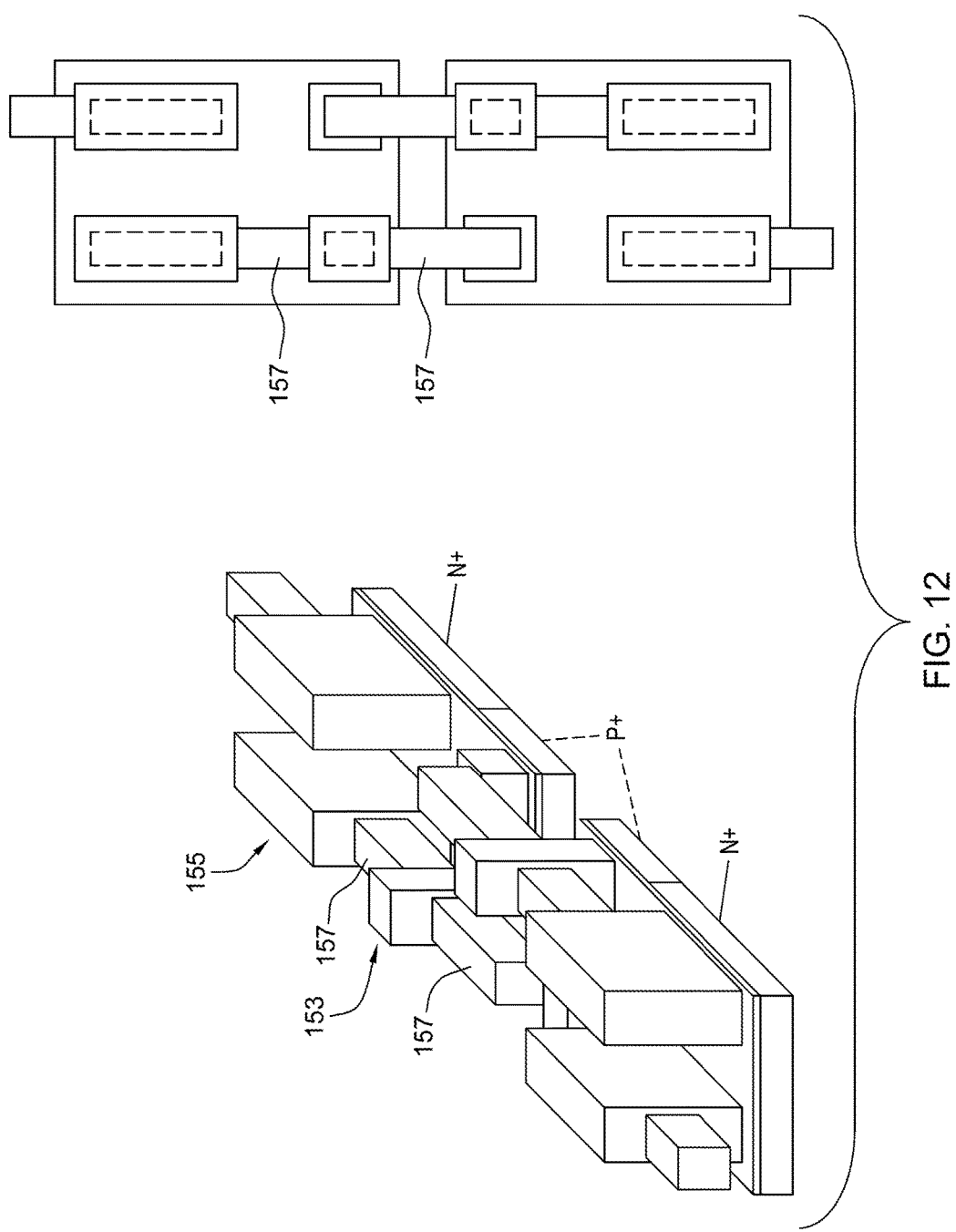
FIG. 12 depicts the structure of FIG. 11 after electrically connecting, e.g., via routing gates, each pull-up transistor and its associated pull-down transistor to the cross-coupled contact portions, respectively, in accordance with one or more aspects of the present invention.

FIG. 12 depicts the structure of FIG. 11 after electrically connecting, e.g., via routing gates 157, each pull-up transistor (e.g., pull-up transistor 153) and its associated pull-down transistor (e.g., pull-down transistor 155) to the cross-coupled contact portions 152 and 154, respectively, in accordance with one or more aspects of the present invention.

Figure 13:
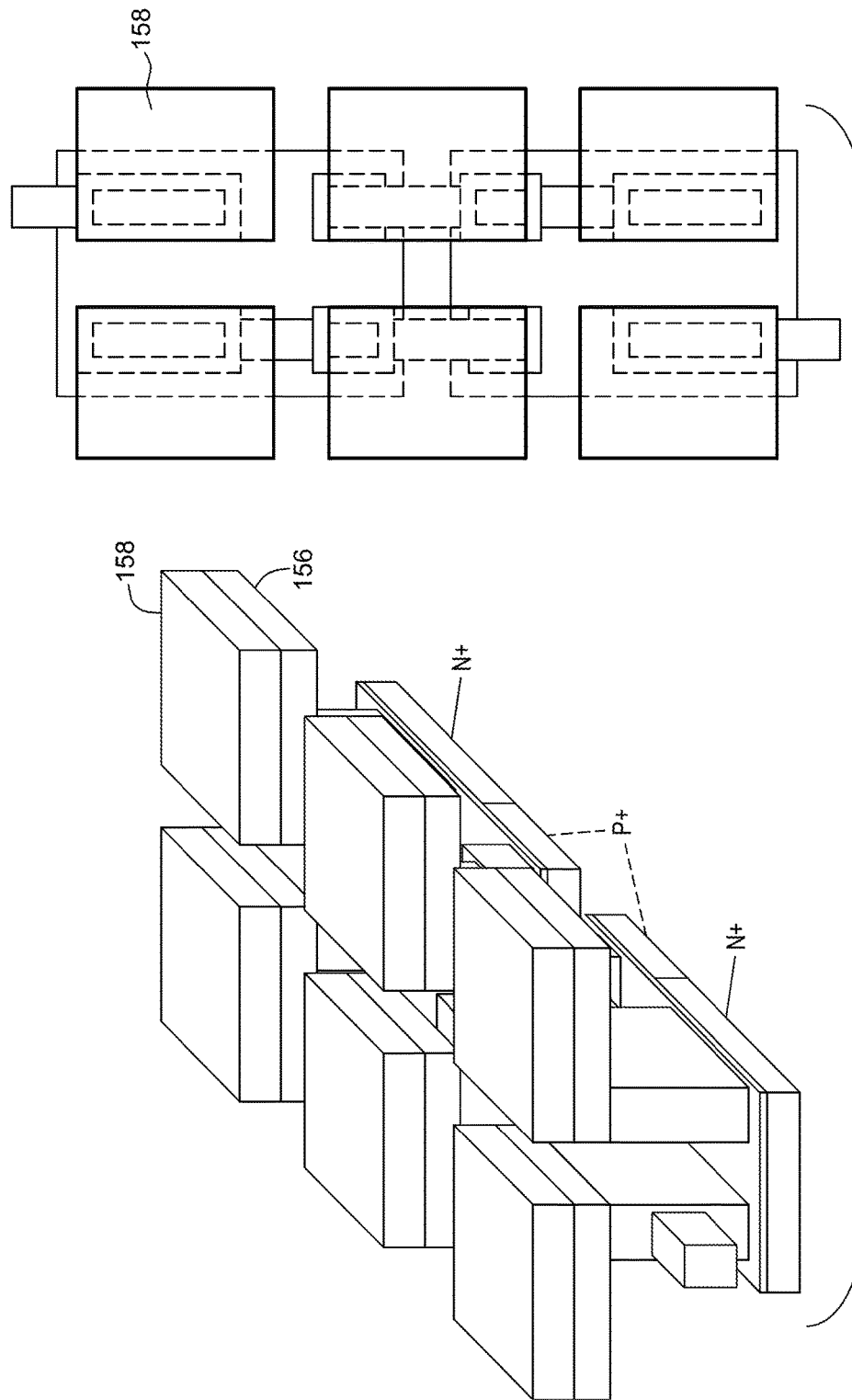
FIG. 13 depicts one example of the structure of FIG. 12 after forming source and drain electrodes and an optional corresponding electrode hard mask, the optional electrode hard masks used for a self-aligned contact process, in accordance with one or more aspects of the present invention.

FIG. 13 depicts one example of the structure of FIG. 12 after forming source and drain electrodes (e.g., electrode 156) and an optional corresponding electrode hard mask (e.g., electrode hard mask 158), the optional electrode hard masks used for a self-aligned contact process, in accordance with one or more aspects of the present invention.

Figure 14:
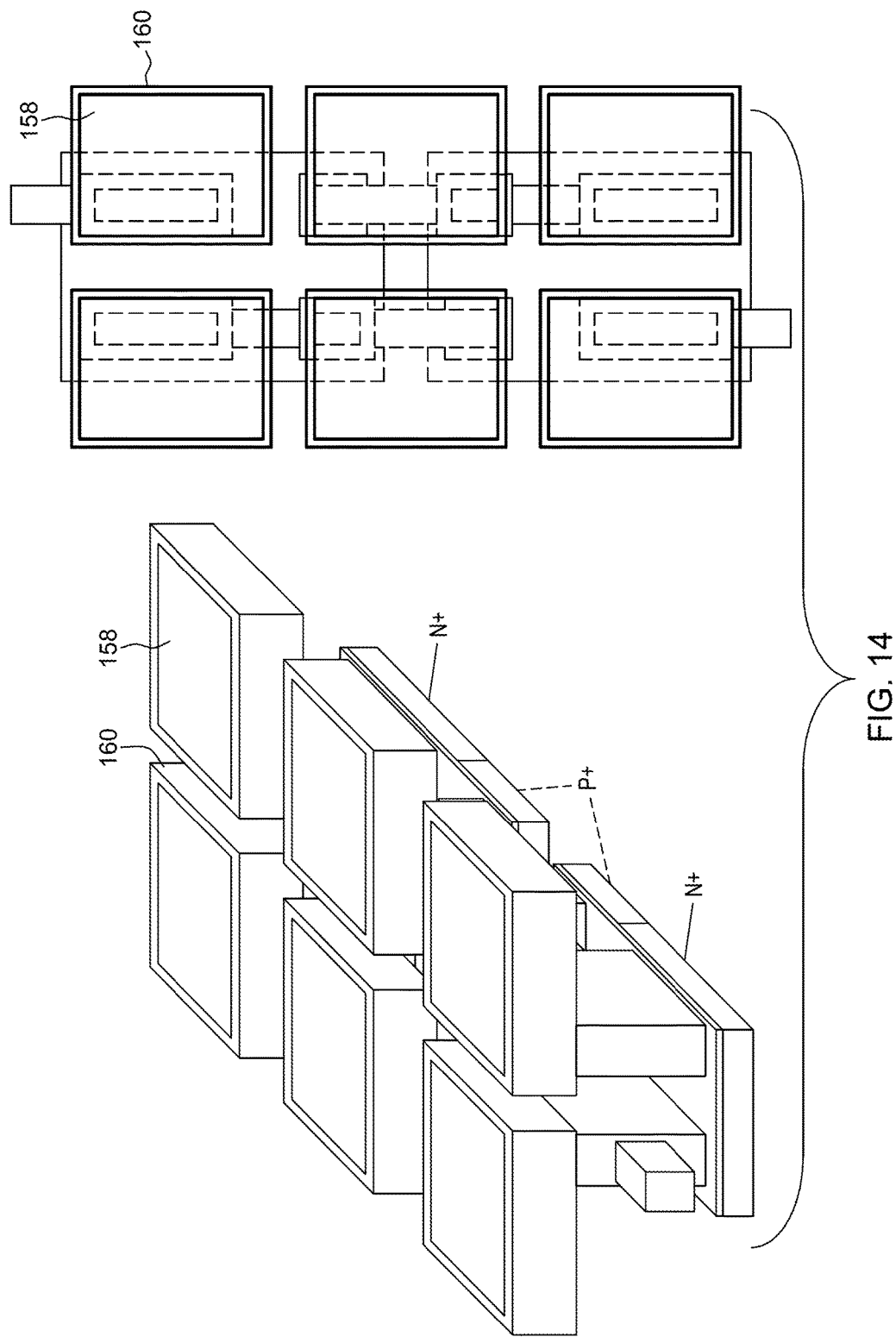
FIG. 14 depicts one example of the structure of FIG. 13 after forming optional spacers around sides of the electrodes and optional corresponding hard masks, the optional spacers for a self-aligned contact process, in accordance with one or more aspects of the present invention.

FIG. 14 depicts one example of the structure of FIG. 13 after forming optional spacers (e.g., spacer 160) around sides of the electrodes and optional corresponding hard masks (e.g., electrode 156 in FIG. 13, and electrode hard mask 158), the optional spacers used for a self-aligned contact process, in accordance with one or more aspects of the present invention.

Figure 15:
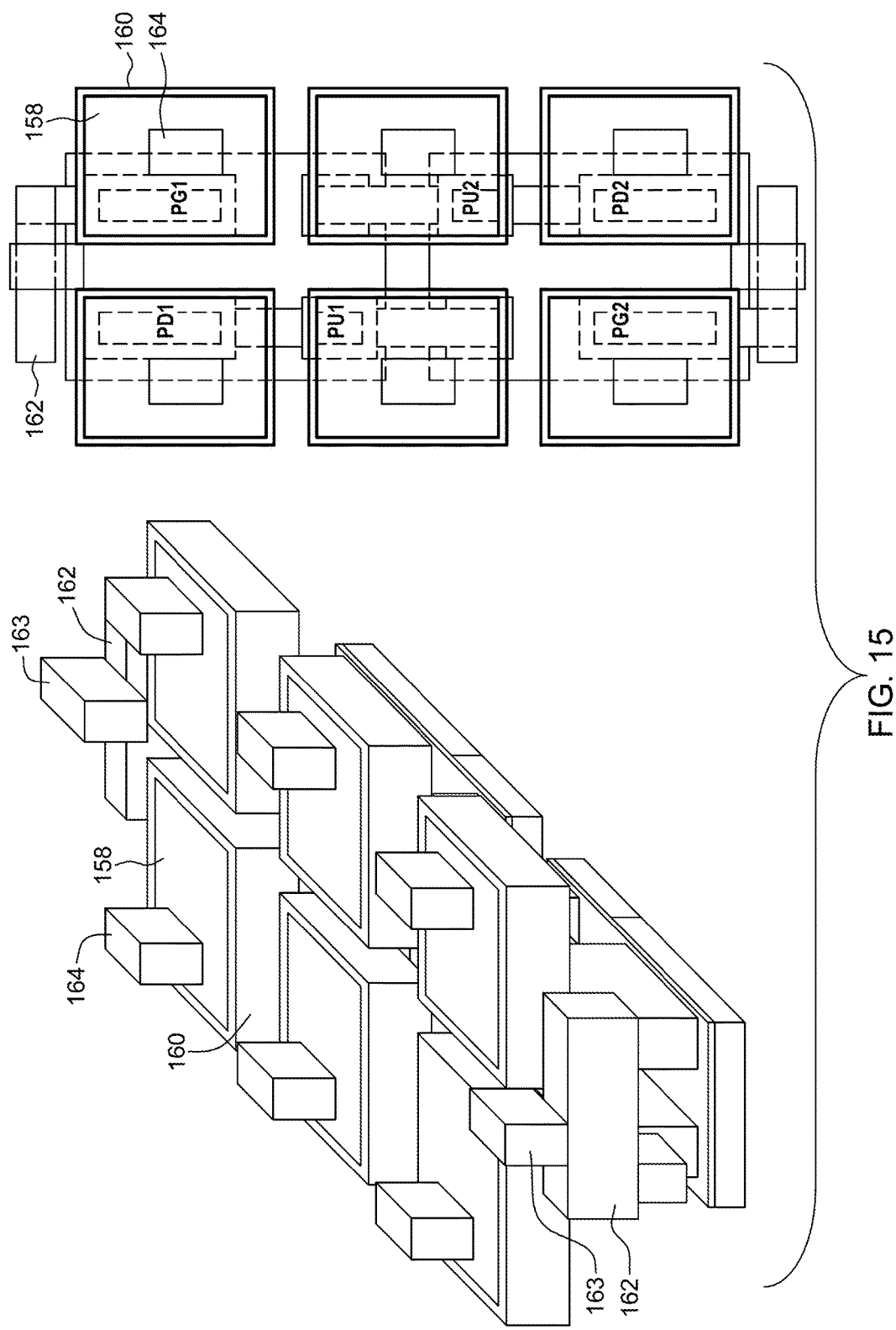
FIG. 15 depicts one example of the structure of FIG. 14 after formation of bottom word line contacts, and corresponding top word line contacts, the top word line contacts formed, in one example, along with source and drain contacts, in accordance with one or more aspects of the present invention.

FIG. 15 depicts one example of the structure of FIG. 14 after formation of bottom word line contacts 162, and corresponding top word line contacts 163, the top word line contacts formed, in one example, along with source and drain contacts (e.g., source/drain contact 164), in accordance with one or more aspects of the present invention.

Figure 16:
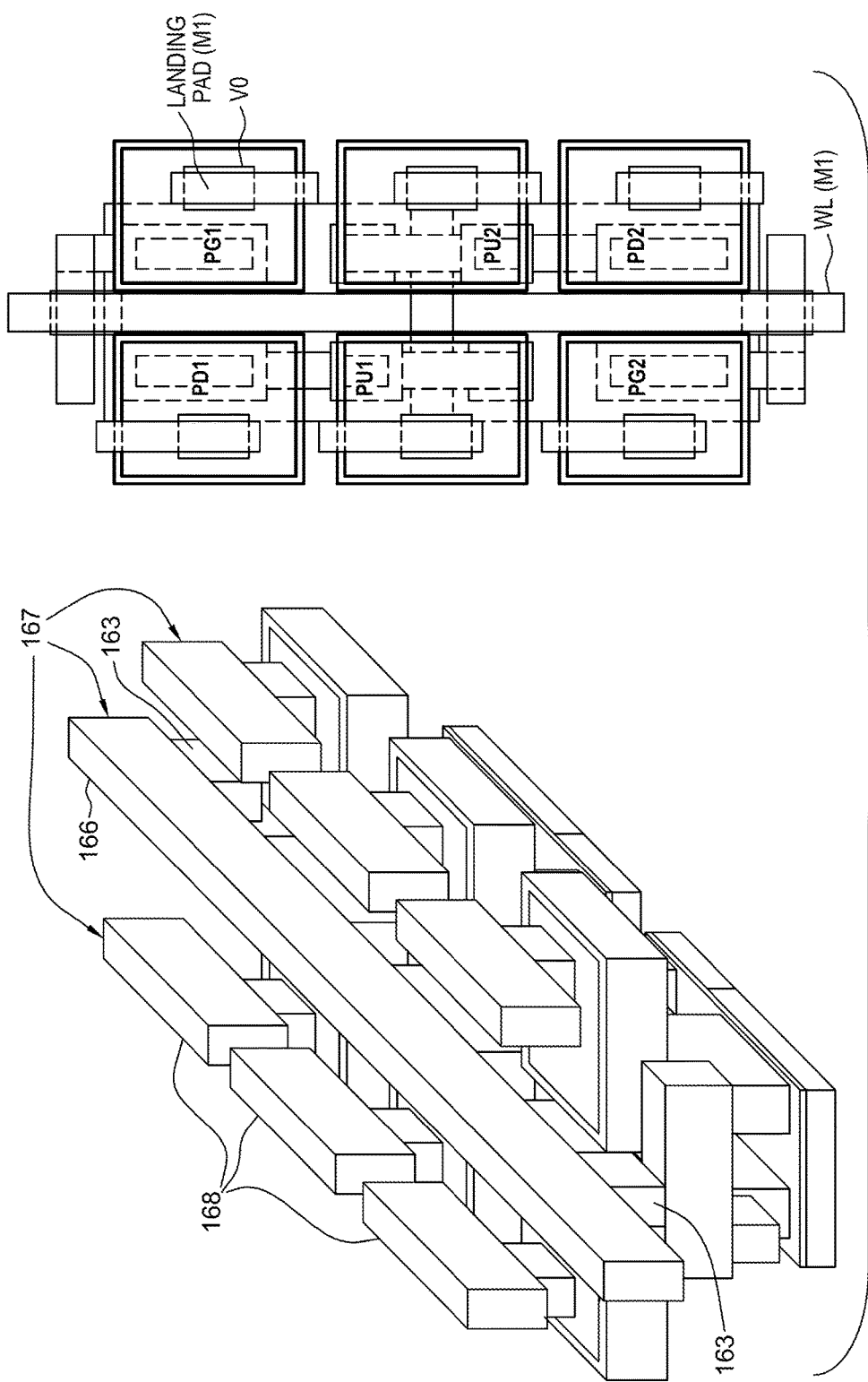
FIG. 16 depicts one example of the structure of FIG. 15 after formation of a word line over the top word line contacts, and bit line landing pads, the word line and bit line landing pads constituting a first metal layer, in accordance with one or more aspects of the present invention.

FIG. 16 depicts one example of the structure of FIG. 15 after formation of word line 166 over top word line contacts 163, and bit line landing pads (e.g., bit line landing pads 168), the word line and bit line landing pads constituting a first metal layer 167, in accordance with one or more aspects of the present invention.

Figure 17:
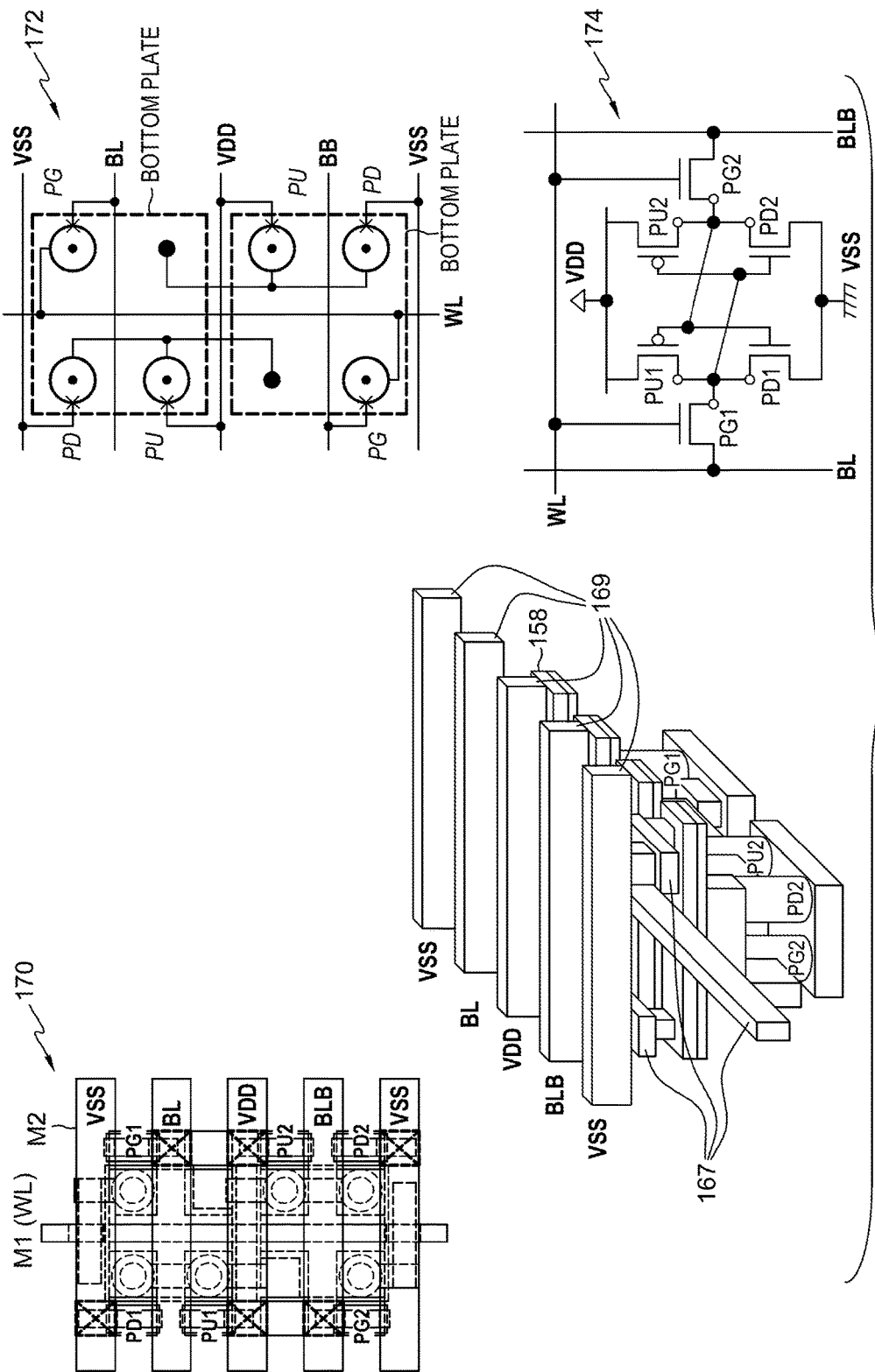
FIG. 17 depicts one example of the structure of FIG. 16 after formation of a second metal layer above the first metal layer, along with a top-down view thereof, as well as corresponding transistor connectivity and schematic views, in accordance with one or more aspects of the present invention.

FIG. 17 depicts one example of the structure of FIG. 16 after formation of a second metal layer 169 above the first metal layer 167, along with a top-down view 170 thereof, as well as corresponding transistor connectivity 172 and schematic 174 views, in accordance with one or more aspects of the present invention.

Figure 18:
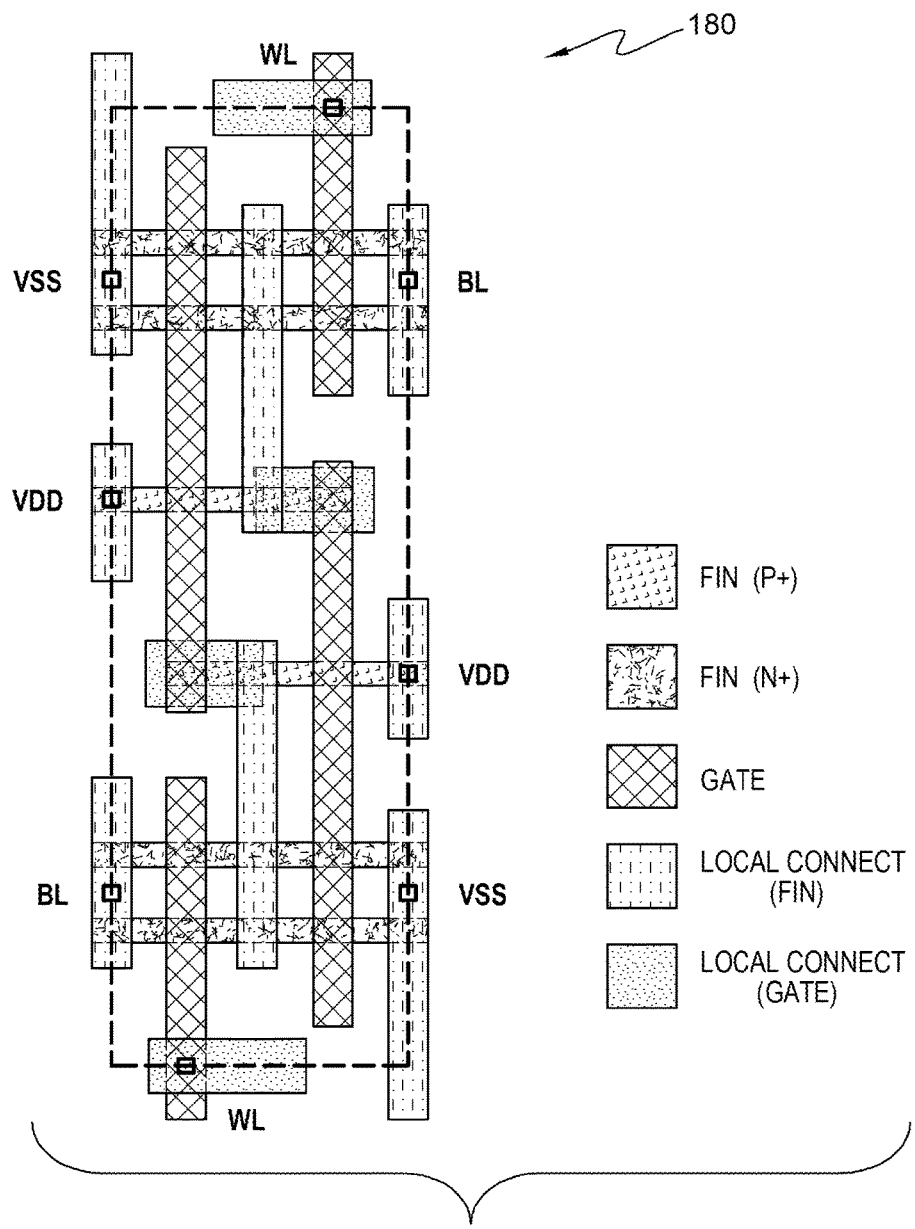
FIG. 18 is a top-down view of another example of a vertical channel transistor-based semiconductor memory structure, each set having one pull-up transistor, two pull-down transistors and two pass-gate transistors that are engaged.

FIG. 18 is a top-down view of another example of a vertical channel transistor-based semiconductor memory structure 180, each set having one pull-up transistor, two pull-down transistors and two-pass gate transistors that are engaged.

In a first aspect, disclosed above is a semiconductor structure. The semiconductor structure includes horizontally adjacent layers of conductive material, and transistors in process on the horizontally adjacent layers of conductive material, each transistor including a vertical channel and a gate electrode wrapped around the vertical channel, each of the adjacent layers of conductive material being a shared bottom source/drain electrode for some of the plurality of transistors. The semiconductor memory structure further includes a cross-coupled contact having at least two portions, each portion on one of the adjacent layers of conductive material, and non-shared top source/drain electrodes on top of each vertical channel and associated gate electrode.

In one example, the transistors may include, for example, at least two sets of transistors, each of the sets of transistors including a pull-up transistor, pull-down transistor(s) and pass gate transistor(s). In one example, the transistors may include, for example, at least two sets of transistors, each of the sets including a pull-up transistor, at least two pull-down transistors and at least two pass gate transistors.

In one example, the adjacent layers of conductive material of the semiconductor memory structure of the first aspect may include, for example, one of a metal and silicide.

In one example, the semiconductor memory structure of the first aspect may further include, for example, an electrical connection between the shared contact and the gate of each pull-up transistor, and an electrical connection between the gate of a given pull-up transistor and the gate of an associated pull-down transistor.

In one example, the semiconductor memory structure of the first aspect may be, for example, part of a SRAM device.

In one example, each vertical channel of the semiconductor memory structure of the first aspect may have, for example, a circular cross-sectional shape.

In one example, each vertical channel of the semiconductor memory structure of the first aspect may have, for example, a rectangular or square cross-sectional shape.

In one example, the semiconductor memory structure of the first aspect may further include, for example, layer(s) of a conductive material over the bottom source/drain electrodes. In one example, the conductive material may include, for example, one of a metal and silicide.

In one example, each gate electrode of the semiconductor memory structure of the first aspect may include, for example, a gate dielectric layer wrapped around the vertical channel, a wrap-around gate electrode, wrap-around workfunction layer(s), a wrap-around conductive layer, and a wrap-around spacer.

In one example, the semiconductor memory structure of the first aspect may further include, for example, hard masks over the non-shared top source/drain electrodes. In one example, the semiconductor memory structure may further include, for example, a spacer wrapped around the top source/drain electrodes and corresponding hard masks.

In one example, the semiconductor memory structure of the first aspect may further include, for example, metallization layer(s) thereover.

In a second aspect, disclosed above is a semiconductor structure. The semiconductor structure includes vertical channel transistors that are horizontally adjacent, each vertical channel transistor including a shared bottom source/drain electrode, a vertical channel on the shared bottom source/drain electrode, a gate wrapped around the vertical channel, and a non-shared top source/drain electrode on the vertical channel and gate. The transistors are grouped according to each non-shared top source/drain electrode.

In one example, the vertical channel transistors may be, for example, grouped into at least two sets, each of the at least two sets including a pull-up transistor, pull-down transistor(s), and pass-gate transistor(s). In one example, the semiconductor structure may be, for example, part of a SRAM memory device. In one example, the semiconductor structure may further include, for example, metallization layer(s) over the semiconductor structure.

In a third aspect, disclosed above is a method. The method includes providing adjacent layers of undoped semiconductor material, and forming channels for vertical transistors, the vertical channels situated on each of the adjacent square-shaped layers. The method further includes doping a first half of each of the adjacent layers with a n-type or p-type dopant, doping a second half of each of the square-shaped adjacent layers with an opposite type dopant to that of the first half, forming wrap-around gates surrounding the vertical channels, and forming top electrodes for the vertical transistors.

In one example, the wrap-around gates of the method of the second aspect may be, for example, self-aligned, and forming the vertical channels may include, for example, forming one of a round cross-sectional shape vertical channel and a rectangular cross-sectional shape vertical channel, and the transistors are formed in groups, each group including a single pull-up transistor and one of (a) a single pull-down transistor and a single pass gate transistor, and (b) at least two pull-down transistors and at least two pass gate transistors.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
    horizontally adjacent layers of conductive material;
    a plurality of transistors in process on the horizontally adjacent layers of conductive material, each transistor comprising a vertical channel and a gate electrode wrapped around the vertical channel, each of the adjacent layers of conductive material being a shared bottom source/drain electrode for some of the plurality of transistors;
    a cross-coupled contact having at least two portions, each portion on one of the adjacent layers of conductive material;
    non-shared top source/drain electrodes on top of each vertical channel and associated gate electrode; and
    wherein the plurality of transistors comprises at least two sets of transistors, each of the at least two sets of transistors having only a pull-up transistor, at least two pulldown transistors and at least two pass gate transistors.

2. The semiconductor structure of claim 1, wherein the adjacent layers of conductive material comprise one of a metal and silicide.

3. The semiconductor structure of claim 1, further comprising:
    an electrical connection between the cross-coupled contact and the gate of each pull-up transistor; and
    an electrical connection between the gate of a given pull-up transistor and the gate of an associated pull-down transistor.

4. The semiconductor structure of claim 1, wherein the semiconductor memory structure is part of a SRAM device.

5. The semiconductor structure of claim 1, wherein each vertical channel has a circular cross-sectional shape.

6. The semiconductor structure of claim 1, wherein each vertical channel has a rectangular or square cross-sectional shape.

7. The semiconductor structure of claim 1, further comprising one or more layers of a conductive material over the bottom source/drain electrodes.

8. The semiconductor structure of claim 7, wherein the conductive material comprises one of a metal and silicide.

9. The semiconductor structure of claim 1, wherein each gate electrode comprises:
  a wrap-around spacer layer wrapped around the vertical channel;
  one or more wrap-around work-function layers wrapped around the wrap-around spacer layer; and
  one or more wrap-around conductive metal layers wrapped around the one or more wrap-around work-function layers.

10. The semiconductor structure of claim 1, further comprising hard masks over the non-shared top source/drain electrodes.

11. The semiconductor structure of claim 10, further comprising a spacer wrapped around the top source/drain electrodes and corresponding hard masks.

12. The semiconductor structure of claim 1, further comprising one or more metallization layers over the semiconductor structure.

13. A semiconductor memory structure, comprising:
  a plurality of vertical channel transistors that are horizontally adjacent, each vertical channel transistor comprising:
  a shared bottom source/drain electrode;
  a vertical channel on the shared bottom source/drain electrode;
  a gate wrapped around the vertical channel; and
  a non-shared top source/drain electrode on the vertical channel and gate;
  wherein the plurality of vertical channel transistors are grouped according to each non-shared top source/drain electrode into at least two sets, each of the at least two sets:
  having only a pull-up transistor:
  at least two pull-down transistors: and
  at least two pass-gate transistors.

14. The semiconductor structure of claim 13, wherein the semiconductor structure is part of a SRAM memory device.

15. The semiconductor structure of claim 14, further comprising at least one metallization layer over the semiconductor structure.

16. A method, comprising:
  providing adjacent layers of undoped semiconductor material;
  forming vertical channels for vertical transistors, the vertical channels situated on each of the adjacent layers;
  doping a first half of each of the adjacent layers with a n-type or p-type dopant;
  doping a second half of each of the adjacent layers with an opposite type dopant to that of the first half;
  forming wrap-around gates surrounding the vertical channels; and
  forming top electrodes for the vertical transistors: and
  wherein the wrap-around gates are self-aligned, wherein forming the vertical channels comprises forming one of a vertical channel having a circular cross-section and a vertical channel having a rectangular cross-section, and wherein the transistors are formed in groups, each group having a single pull-up transistor, at least two pull-down transistors and at least two pass gate transistors.

* * * * *